(12) United States Patent
Nakagawa et al.

(10) Patent No.: US 7,676,772 B1
(45) Date of Patent: Mar. 9, 2010

(54) LAYOUT DESCRIPTION HAVING ENHANCED FILL ANNOTATION

(75) Inventors: O. Samuel Nakagawa, Redwood City, CA (US); Andrew B. Kahng, Del Mar, CA (US); Pakman Wong, Cupertino, CA (US)

(73) Assignee: Tela Innovations, Inc., Campbell, CA (US)

( * ) Notice: Subject to any disclaimer, the term of this patent is extended or adjusted under 35 U.S.C. 154(b) by 464 days.

(21) Appl. No.: 11/486,936

(22) Filed: Jul. 13, 2006

(51) Int. Cl.
  *G06F 17/50* (2006.01)
(52) U.S. Cl. ............................................. 716/2; 716/8
(58) Field of Classification Search ..................... 716/2, 716/8
  See application file for complete search history.

(56) References Cited

U.S. PATENT DOCUMENTS

| | | | | |
|---|---|---|---|---|
| 7,039,881 | B2* | 5/2006 | Regan | 716/3 |
| 7,509,622 | B2* | 3/2009 | Sinha et al. | 716/21 |
| 2003/0229875 | A1* | 12/2003 | Smith et al. | 716/10 |
| 2004/0237061 | A1 | 11/2004 | Kahng et al. | |

OTHER PUBLICATIONS

P. Gupta, A. B. Kahng, C. H. Park, Detailed Placement for Improved Depth of Focus and CD Control, Proc. Asia and South Pacific Design Automation Conf,. Jan. 2005, pp. 343-348.
Puneet Gupta, Andrew B. Kahng, Puneet Sharma, Dennis Sylvester, Selective Gate-Length Biasing for Cost-Effective Runtime Leakage Control, DAC 2004, Jun. 7-11, 2004, San Diego, California, USA.

\* cited by examiner

*Primary Examiner*—Vuthe Siek
*Assistant Examiner*—Brandon W Bowers
(74) *Attorney, Agent, or Firm*—Martine Penilla & Gencarella, LLP

(57) ABSTRACT

Computer readable media hosting a layout description of electric circuitry that includes a description of prospective fill units and includes characteristic data noting at least one characteristic of each fill unit. In one preferred embodiment, each prospective fill unit includes just a single prospective fill element. Also, in a preferred embodiment, said characteristic data includes effect on electrical characteristics of nearby electrical circuitry. These electrical characteristics may further include timing characteristics and capacitance characteristics. The effect on the thickness of nearby connective elements also may be noted.

13 Claims, 2 Drawing Sheets

| SHADOW FILL UNIT | CONDUCTOR DESIGNATOR | SPEED/TIME/ CAPACITANCE/ RESISTANCE CHANGE | CONDUCTOR DESIGNATOR | SPEED/TIME/ CAPACITANCE/ RESISTANCE CHANGE |
|---|---|---|---|---|
| 1128ABF | 1128ACD | 0.2%; 0.1 picoseconds; 20 femtofarads; 200 microohm | 1128AFG | 0.1%; 0.5 picoseconds; 10 femtofarads; 200 microohms |
| 1129ABF | 1128ACD | 0.3%; 0.15 picoseconds; 30 femtofarads; 300 microoohms | 1128AFG | 0.2%; 0.7 picoseconds; 20 femtofarads; 400 micoohms |

FIG. 2

| SHADOW FILL UNIT | AREA DESIGNATOR | AVERAGE THICKNESS CHANGE | AREA DESIGNATOR | AVERAGE THICKNESS CHANGE |
|---|---|---|---|---|
| 1128ABF | 1128 | -20 nm -10% | 1129 | - 5 nm - 2.5% |
| 1129ABF | 1129 | -30 nm -15% | 1128 | -10 nm -5% |

FIG. 3

LAYOUT DESCRIPTION HAVING ENHANCED FILL ANNOTATION

BACKGROUND

Integrated circuits, also referred to as "chips", must have a multi-layer interconnection structure, including a plurality of interwoven conductive lines to electrically connect elements in the semiconductor layers. Different techniques are used to build this structure, depending on whether the chip is aluminum-based or copper-based. A problem that is faced in constructing an aluminum interconnection structure is varying dielectric thickness, whereas for a copper interconnection structure varying copper thickness can be a problem.

Copper-based chips are produced, in part, using a damascene or dual-damascene process. In this process, the underlying dielectric material layer is patterned with open trenches that are created in the desired locations of the prospective conductive lines. A thick coating of copper that significantly overfills the trenches is deposited on the dielectric material, and chemical-mechanical planarization or polishing (CMP) is used to remove the copper to the level of the top of the dielectric insulating layer.

With successive layers of insulator and copper, the multi-layer (5-10 metal layers or more) interconnection structure is created. Unfortunately, it has not yet been possible to match the rate at which copper is removed during CMP with the rate at which the dielectric material is removed, with the copper generally being removed more rapidly. Consequently, an area with more embedded copper structures will generally be removed more quickly, potentially leading to an uneven surface and uneven copper structure thickness. In turn, this could affect performance in an unpredictable manner, because the electrical characteristics of the copper structures are affected by their thicknesses.

With respect to the CMP process, ideally all of the dielectric would be uniformly exposed at the same moment, and the process would be brought to a stop at that moment. Sometimes, however, the dielectric layer is exposed in one region, but not exposed in another. The CMP process must continue until the dielectric is exposed across all regions, causing some copper to be recessed relative to the dielectric ("dishing", or local "step height"), and removal of dielectric in an area having a high density of conductive lines, versus areas having few or no conductive lines ("erosion", or global "step height"). For copper-based chip fabrication, processes have been developed that remove the dielectric more quickly than the copper, to minimize the above described effects.

For aluminum-based chips, aluminum structures are constructed first, and then covered with dielectric. Typically, however, the top of the dielectric layer is not flat after the process of covering the aluminum structures is complete. Although CMP is used to create a flat top surface, the top surface of the dielectric will tend to be lower where it is covering a low density of aluminum structure, and higher where a high density of aluminum structure is covered. This variation is undesirable and dummy or "fill" elements are typically added to a layout to minimize this effect. Unlike the situation with respect to a copper-based chip, however, metal structure thicknesses are not affected. For both aluminum- and copper-based chips, the fill elements can be either "floating", i.e., having no conducting path to either a power or a ground supply, or "tied", i.e., having an electrical connection directly to power or ground. Floating fill in general has less capacitance impact on nearby signal wires than does tied fill. On the other hand, tied fill is a superior choice for control of crosstalk noise or loop inductance.

Complicating this situation is the fact that modern-day chip design is increasingly becoming a process in which intellectual property (IP) in the form of circuit layouts from various suppliers is integrated together by an IP integrator. In some instances the IP integrator is one part of a large corporate entity, and the IP supplier is another. In other instances the IP integrator purchases IP from a separate vendor or vendors. The resultant integrated layout is then fabricated at a foundry, which may or may not be owned by the IP integrator.

Frequently, for a particular piece of IP, non-functional metal fill elements will have been added to the layout, thereby increasing the uniformity of the density of the metal pattern. This, in turn, prevents unevenness that could be caused by the CMP process, as explained above. The metal density of a first piece of IP may not, and frequently does not, however, match that of a second, prospectively neighboring piece of IP. The foundries have rules for the minimum and maximum density of the metal patterns, and the IP vendors typically design their pieces with "max fill" so as to approximate the upper metal pattern density limit or "min fill" so as to approximate the lower metal density limit. While we use the term "density" for pedagogic purposes in this discussion, it should be noted that fill elements ultimately are used to increase the uniformity of the CMP process outcome itself. Thus, "density" may be viewed as a proxy for post-CMP thickness or step height, and in this context "max fill" denotes a solution with maximum amount of inserted fill subject to a thickness variation constraint, while "min fill" denotes a solution with minimum inserted fill subject to a thickness variation constraint.

Accordingly, the IP integrator is faced with a troublesome problem of matching metal pattern densities between pieces of IP or between a piece of IP and an adjacent custom design. This is complicated by restrictions generally placed on the removal of metal fill elements by the IP providers, who will typically not guarantee the functionality of a piece of IP from which fill elements have been removed. Although fill elements may typically be added to the less dense metal pattern, this is done by the designer with some uncertainty as to the effect of these additions.

SUMMARY

The following embodiments and aspects thereof are described and illustrated in conjunction with systems, tools and methods, which are meant to be exemplary and illustrative, not limiting in scope. In various embodiments, one or more of the above-described problems have been reduced or eliminated, while other embodiments are directed to other improvements.

In a first separate aspect, the present invention may take the form of computer readable media hosting a layout description of electric circuitry that includes a description of prospective fill shapes or fill units (we use the term 'fill unit' to denote a plurality of fill shapes) and includes characteristic data noting at least one characteristic of each fill unit.

In a second separate aspect, the present invention may take the form of computer readable media hosting a computer program adapted to accept a description of a chip layout that includes a description of prospective fill units and includes characteristic data, noting at least one characteristic of each fill unit. Also, the computer program is adapted to use the characteristic data to create an improved chip layout.

In a third separate aspect, the present invention is a method of optimizing the layout of a metal based chip, comprising accepting a description of a chip layout that includes a description of prospective fill units and includes characteristic data noting at least one characteristic of each fill unit. In the method, the characteristic data is used to improve the chip layout.

In addition to the exemplary aspects and embodiments described above, further aspects and embodiments will become apparent by reference to the drawings and by study of the following detailed descriptions.

BRIEF DESCRIPTION OF THE FIGURES

Exemplary embodiments are illustrated in referenced figures of the drawings. It is intended that the embodiments and figures disclosed herein are to be considered illustrative rather than restrictive.

FIG. 2 is a table showing the relationship between prospective fill units and timing of nearby conductive lines.

FIG. 3 is a table showing the relationship between prospective fill units and the thickness of nearby areas.

DETAILED DESCRIPTION OF THE PREFERRED EMBODIMENTS

Figure 1:
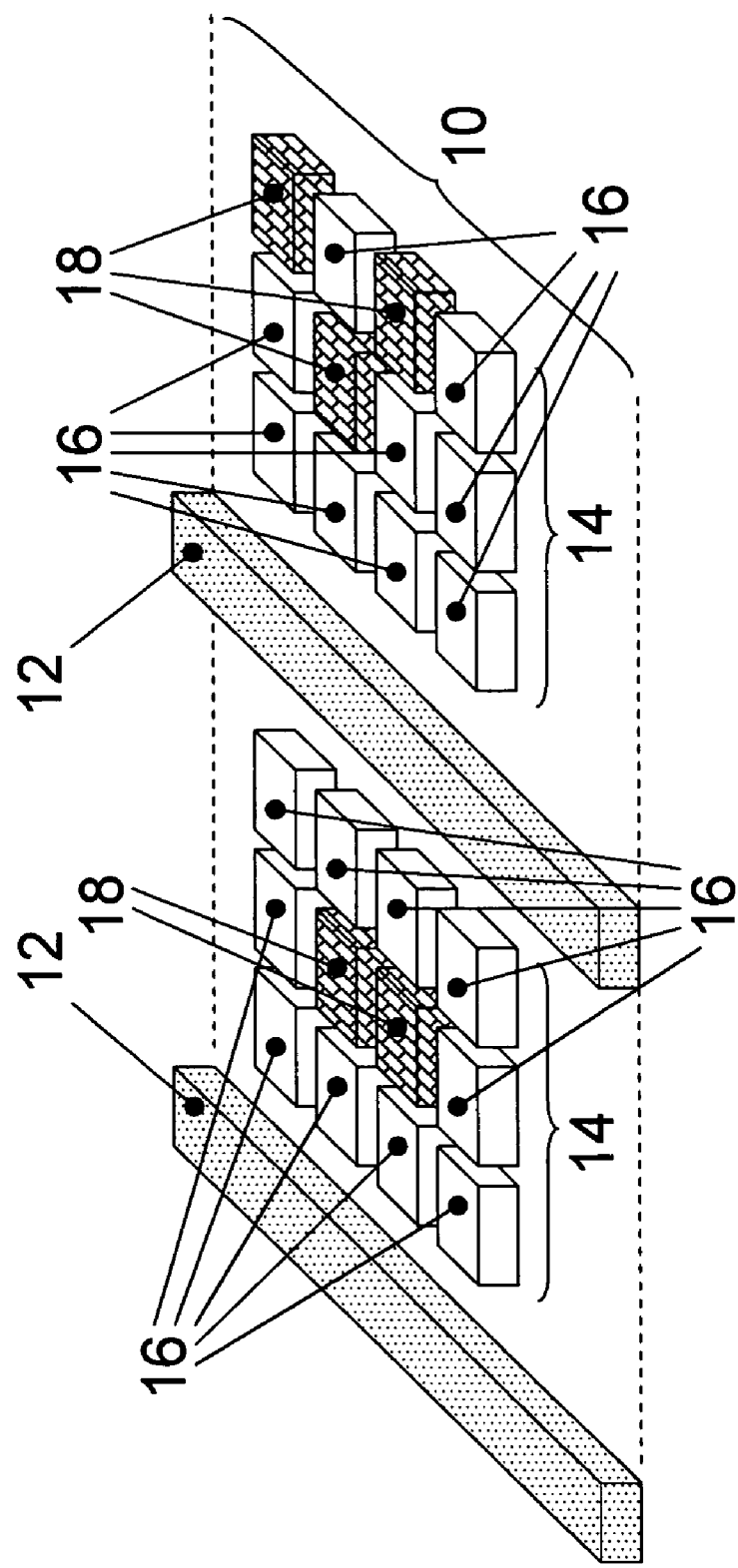
FIG. 1 is a perspective view of an electrical connective layer layout that includes fill elements.

Referring to FIG. 1, a network layout 10 that is completed with respect to the conductive lines 12 has dummy metal pattern or "fill" elements 14 (collectively "fill") added to it so that it will have a fairly uniform metal pattern density. According to a first preferred embodiment, the addition of the fill elements 14 is done so as not to perturb the timing of the critical paths of the network. That is, the critical timing paths are identified and no fill elements 14 are added closer than a threshold distance from these critical paths.

In addition, fill units are defined, each of which may consist of a single fill element 14 or a group of fill elements 14. Each fill unit (each of which is a single fill element 14, in FIG. 1) is designated as either locked 16, if it is closer to a conductive line than some threshold displacement, for example a distance of 3 microns, or as shadow or removable fill 18 if it is further than the respective threshold displacement from any other conductive line 12. Note that depending on timing criticality or other attributes of a given conductive line, each line may have its particular threshold displacement defining the boundary between locked fill and shadow fill. Further note that a first displacement may be larger than a second displacement by virtue of it corresponding to a larger physical distance, or by virtue of it having a lesser effect on electrical performance.

In an additional preferred embodiment, the designation of fill units as being either locked or shadow is made on the basis of the timing impact of the fill unit. In yet another preferred embodiment, it is the parasitic impact of the fill unit that determines the categorization. Although both timing impact and parasitic impact are functions of displacement of the fill unit from the conductive line, there is not a direct correlation between these parameters.

One advantage of designating fill as being locked or shadow is that as the fill around the periphery of the IP is likely to be fairly far away from the conductive lines 12, the peripheral fill is quite likely to be designated as shadow fill 18. This is a great advantage over the entirely locked fill of the prior art, because the peripheral areas of a first IP tend to have the greatest effect on efforts to integrate the first IP together with a neighboring second IP. In cases in which the second IP has a lower density of metal patterning than the first, it is highly advantageous to remove the peripheral fill that is designated to be near the second IP, from the first IP.

The designation of fill as being either locked or shadow can be done in various ways depending on the computer aided design (CAD) file format that is being used. In a GDS Stream format, which in this context includes GDSII and all future GDS progeny, a different layer/data type could be assigned to each type of element. In one preferred embodiment, conductive lines 12 are assigned as being in layer/data type 15.0, locked fill could be assigned to layer/data type 15.1 and shadow fill could be assigned to layer/data type 15.2. Any IP integrator used must be configured to respond to the true meaning of the various layer/data types. Although Design Exchange Format (DEF) currently only has a single level of notation for fill data, more could, and possibly will be added in future versions. OASIS, another popular layout format, may also be adapted to include fill effect information. Finally, in an additional preferred embodiment, a separate, parallel file is used to designate the status of each fill unit.

In an alternative preferred embodiment, either instead of or in addition to some of the fill being locked, the effect of the removable fill on nearby circuit features is computed and annotated. Referring to FIG. 2, for each shadow fill feature the effect on neighboring conductive lines 12, either in percentage effect on speed of signal transmission, absolute change in time for a signal to be transmitted (shown in picoseconds), or both (as shown) is noted. Also, change in the capacitance (total capacitance affecting a signal moving on the conductive line or on any second, proximate line to which the conductive line is coupled) or the resistance of the nearby conductive line is entered. Although the table of FIG. 2 shows all four quantities as being listed, in one preferred embodiment, a smaller number of quantities would be listed. Typically the number of conductive lines affected by a fill unit is greater than two. Accordingly an actual table would typically have more than two sets of columns for each fill unit.

Additionally, other quantities can be noted in addition to, or instead of, those shown. Among these is included signal integrity or coupling capacitance (also referred to as "cross talk" between conductive lines). The presence of fill elements can increase coupling capacitance between conductive lines. In a simple embodiment, each fill shape is noted as either "having signal integrity impact" or "not having signal integrity impact." In a more complex embodiment, a metric of the impact would be listed with reference to the affected lines.

Another quantity which is listed in a preferred embodiment is IR drop. This is the drop in voltage over the length of a conductive line, for a particular current. If the IR drop is too great, the voltage reaching the device at the far end of the conductive line might not be sufficient to drive that device. This quantity is more likely to vary with fill placement for copper-based chips because it is directly related to conductive line thickness and, as noted earlier, CMP does not have a thickness impact on aluminum connectors. Further, the effect of fill on IR drop is more apparent with tied fill than with floating fill.

It is typically a design goal to minimize power consumption of the circuit as a whole and of each conductive line. Dynamic power is given by the expression $CfV^2$, where C is line capacitance, f is frequency and V is the voltage drop over the line. Fill placed near a conductive line increases the dynamic power of the line. Accordingly, when dynamic power is the most important quantity, the fill elements 14 near the conductive line are marked as shadow fill and the fill elements 14 further from the line are marked as being locked fill.

In an additional preferred embodiment the change in electromigration of nearby conductive lines caused by the presence of each fill shape or fill unit is a quantity that is appended to the layout. Electromigration is the transport of material caused by the gradual movement of the ions in a conductor due to the momentum transfer between conducting electrons and diffusing metal atoms and is inversely proportional to the conductor's cross-section. The presence of a nearby fill shape or a group of fill shapes can alter the thickness or the width of a conductive line and impact its electromigration robustness.

In yet another additional preferred embodiment the effect on line inductance, which affects the level of ground bounce and/or power bounce, is noted for each fill element or fill unit. Alternatively, the ground/power bounce effect may be noted for each fill element or fill unit for nearby conductive lines. This effect is more likely to be apparent with tied fill than with floating fill.

In another alternative preferred embodiment, illustrated in FIG. 3, the effect of a fill unit on the thickness of the area containing the fill unit, and the most affected neighboring area is noted. In one preferred embodiment, the effect is given only in percentage change in thickness, and in another preferred embodiment, in absolute change in thickness. In yet another preferred embodiment, the change in thickness caused by the addition of a fill unit is given in the form of a function of the distance from the fill unit. For example a very simple function could take the form:

$$t = t_o + t_\delta e^{-cd} \quad (1)$$

where t=thickness; $t_o$=thickness without the fill;

$t_\delta$=change in thickness, relative to $t_o$ at the fill center (typically a negative value for copper fill); and d is distance from the fill center measured in nanometers and is never negative and c is a constant. In an additional alternative preferred embodiment, the effect of each fill unit 14 on local dishing, erosion and/or step height (see Background) is noted.

The IP integrator may take advantage of the additional data provided by either manually removing fill units from a max fill piece of IP on the prospective chip or manually adding fill units to a min fill piece of IP. Alternatively, the IP integrator may perform one or both of these functions automatically by using an optimizer program that is designed to accept the fill effect information and use it to arrive at a close-to-optimum design for the overall chip. In the instance that electrical information has been appended to the IP layout file (as illustrated in FIG. 2), this process would be an optimization of the electrical characteristics of the chip, with the optimizer tasked to meet an objective or cost function for the chip. This function could include chip yield and/or chip performance. If thickness information is included, the optimization could be designed to produce a chip with as flat a surface as possible, while achieving minimal change to the electrical characteristics of the various IP elements.

In one preferred embodiment, a suggested or a specified order of fill removal or addition is appended to the layout file. This order is intended to aid an IP integrator in adjusting the fill pattern to facilitate the integration of the IP with adjacent IP, while maintaining, to as great a degree possible, IP performance and ease of manufacture.

While a number of exemplary aspects and embodiments have been discussed above, those possessed of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

The invention claimed is:

1. A method of optimizing a chip layout section, comprising:

generating an initial version of a chip layout section to include a number of locked fill units and a number of shadow fill units, wherein the locked fill units are not removable from the chip layout section during integration of the chip layout section into an overall chip layout, and wherein the shadow fill units are removable from the chip layout section during integration of the chip layout section into the overall chip layout, wherein generating the initial version of the chip layout section includes generating an annotation of one or more electrical effects caused by each shadow fill unit, whereby the one or more electrical effects caused by a given shadow fill unit on a number of affected conductive features within the chip layout section is tabulated against the given shadow fill unit for each of the number of affected conductive features within the chip layout section, wherein evaluating the annotation is performed by a computer; and evaluating the annotation of the one or more electrical effects caused by each shadow fill unit as tabulated within the initial version of the chip layout section to identify which of the number of shadow fill units are to be removed from the initial version of the chip layout section to generate an optimized version of the chip layout section;

removing the identified shadow fill units from the initial version of the chip layout section to generate the optimized version of the chip layout section.

2. The method of claim 1, wherein evaluating the annotation of the one or more electrical effects caused by each shadow fill unit as tabulated within the initial version of the chip layout section is performed to improve timing characteristics of the number of affected conductive features within the chip layout section.

3. The method of claim 1, wherein the initial version of the chip layout section identifies each of the number of locked fill units as locked and identifies each of the number of shadow fill units as shadow.

4. The method of claim 3, wherein fill units near to an edge of the initial version of a chip layout section said first section are designated as shadow fill units.

5. The method of claim 4, further comprising:

removing some of the shadow fill units near to the edge of the chip layout section to reduce a layout density near to the edge of the chip layout section so as to more closely match a layout density of a neighboring chip layout section.

6. The method of claim 1, wherein generating an initial version of the chip layout section is performed by an outside vendor, and wherein evaluating the annotation of the one or more electrical effects caused by each shadow fill unit, removing the identified shadow fill units from the initial version of the chip layout section to generate the optimized version of the chip layout section, and recording the optimized version of the chip layout section on the computer readable storage medium is performed by an integrated circuit integrator separate from the outside vendor.

7. The method of claim 1, wherein the one or more electrical effects caused by the given shadow fill unit includes a signal timing impact on each of the number of affected conductive features and a parasitic impact on each of the number of affected conductive features.

8. The method of claim 1, wherein the one or more electrical effects caused by the given shadow fill unit on a given affected conductive feature includes:
- a percent effect on a speed of signal transmission on the given affected conductive feature,
- an absolute change in time for a signal to be transmitted on the given affected conductive feature,
- a change in capacitance on the given affected conductive feature,
- a change in resistance on the given affected conductive feature,
- a signal integrity impact on the given affected conductive feature,
- a drop in voltage over a length of the given affected conductive feature,
- a change in dynamic power of the given affected conductive feature,
- a change in electromigration of the given affected conductive feature,
- an inductance effect on the given affected conductive feature,
- an effect on ground bounce on the given affected conductive feature,
- an effect on power bounce on the given affected conductive feature,
- or a combination thereof.

9. The method of claim 1, wherein generating the initial version of the chip layout section includes generating an annotation of one or more physical effects caused by each shadow fill unit, whereby the one or more physical effects includes an effect on thickness of a chip area that includes the shadow fill unit.

10. The method of claim 9, wherein the effect on thickness of the chip area that includes the shadow fill unit is defined as a function of distance from the shadow fill unit.

11. The method of claim 10, wherein the effect on thickness of the chip area is defined as:

$$t=t_o+\{t_\delta*\exp[(-c)*(d)]\},$$

wherein t equals thickness of chip area, $t_o$ equals thickness of chip area without the shadow fill unit, $t_\delta$ equals change in thickness of the chip area relative to $t_o$ at a centerpoint of the shadow fill unit, d equals distance from the centerpoint of the shadow fill unit, and c equals a constant value.

12. The method of claim 1, wherein the initial version of the chip layout section includes a suggested order of shadow fill unit removal.

13. The method of claim 1, wherein the initial version of the chip layout section is represented in a GDS Stream Format, a Design Exchange Format, or an OASIS Format.

* * * * *